(12) United States Patent
Gluschenkov et al.

(10) Patent No.: US 7,271,049 B2
(45) Date of Patent: Sep. 18, 2007

(54) METHOD OF FORMING SELF-ALIGNED LOW-K GATE CAP

(75) Inventors: Oleg Gluschenkov, Wappingers Falls, NY (US); Jack A. Mandelman, Flat Rock, NC (US); Michael P. Belyansky, Bethal, CT (US); Bruce B. Doris, Brewster, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/514,605

(22) Filed: Sep. 1, 2006

(65) Prior Publication Data

US 2006/0289909 A1    Dec. 28, 2006

Related U.S. Application Data

(62) Division of application No. 10/904,391, filed on Nov. 8, 2004.

(51) Int. Cl.
*H01L 21/8238* (2006.01)
(52) U.S. Cl. .............. 438/230; 257/327; 257/759; 257/E21.626; 257/E21.64
(58) Field of Classification Search ......... 438/197, 438/230; 257/E21.626, E21.64
See application file for complete search history.

(56) References Cited

U.S. PATENT DOCUMENTS

| | | | |
|---|---|---|---|
| 6,194,748 B1 | 2/2001 | Yu | |
| 6,335,248 B1 | 1/2002 | Mandelman et al. | |
| 6,383,878 B1 | 5/2002 | Huang | |
| 6,555,892 B2* | 4/2003 | Horstmann et al. | 257/508 |
| 6,607,952 B1 | 8/2003 | Yagishita et al. | |
| 6,642,585 B2* | 11/2003 | Ohuchi et al. | 257/388 |
| 6,724,051 B1 | 4/2004 | Woo et al. | |
| 6,924,184 B2 | 8/2005 | Cave et al. | |
| 2002/0079557 A1* | 6/2002 | Ahn et al. | 257/632 |
| 2004/0063264 A1* | 4/2004 | Zheng et al. | 438/199 |
| 2004/0198006 A1* | 10/2004 | Jeng | 438/299 |

* cited by examiner

*Primary Examiner*—Jerome Jackson
*Assistant Examiner*—Paul Budd
(74) *Attorney, Agent, or Firm*—Scully, Scott, Murphy & Presser, P.C.; H. D. Schnurmann

(57) ABSTRACT

A CMOS structure in which the gate-to-drain/source capacitance is reduced as well as various methods of fabricating such a structure are provided. In accordance with the present invention, it has been discovered that the gate-to-drain/source capacitance can be significantly reduced by forming a CMOS structure in which a low-k dielectric material is self-aligned with the gate conductor. A reduction in capacitance between the gate conductor and the contact via ranging from about 30% to greater than 40% has been seen with the inventive structures. Moreover, the total outer-fringe capacitance (gate to outer diffusion+gate to contact via) is reduced between 10-18%. The inventive CMOS structure includes at least one gate region including a gate conductor located a top a surface of a semiconductor substrate; and a low-k dielectric material that is self-aligned to the gate conductor.

9 Claims, 12 Drawing Sheets

METHOD OF FORMING SELF-ALIGNED LOW-K GATE CAP

RELATED APPLICATIONS

This application is a divisional of U.S. application Ser. No. 10/904,391, filed Nov. 8, 2004.

FIELD OF THE INVENTION

The present invention relates to complementary metal oxide semiconductor (CMOS) technology and more particularly to a CMOS structure that includes a low dielectric constant (low-k) gate cap or sleeve that is self-aligned to a previously formed gate conductor. The presence of the low-k gate cap or sleeve reduces gate-to-drain/source capacitance in the CMOS structure. The present invention also relates to methods of fabricating such a CMOS structure.

BACKGROUND OF THE INVENTION

With continuous transistor scaling, gate-to-drain (source) capacitance increases due to the increased proximity of the source/drain metallization contacts (vias) to the gate conductor. For instance, the distance between the contact via and the gate conductor can be as low as 40 nm in dense logic circuits such as fast static random access memory (SRAM) cells in 65 nm technology. With misalignment of the contact via with respect to the gate, the spacing between the gate and the via can be significantly less than 40 nm. To make matters worse, due to Miller effect the capacitance between the gate and drain via is multiplied by the gain of the CMOS stage.

As a result, the total gate-to-drain/source capacitance becomes a significant portion of the overall load capacitance for fast, lightly loaded CMOS circuits with transistors fabricated in 65 nm technology and below. By reducing the total gate-to-drain capacitance, significant leverage in increasing circuit speed can be realized.

Other advantages of inherently reduced gate Miller capacitance include a higher stability for memory cells (due to less charge coupling) and a higher packaging density.

In view of the above, there is still a need for providing a CMOS structure in which the gate-to-drain/source capacitance is reduced.

SUMMARY OF THE INVENTION

The present invention provides a CMOS structure in which the gate-to-drain/source capacitance is reduced as well as various methods of fabricating such a structure. In accordance with the present invention, it has been discovered that the gate-to-drain/source capacitance can be significantly reduced by forming a CMOS structure in which a low-k dielectric material is self-aligned with the gate conductor. A reduction in capacitance between the gate conductor and the contact via ranging from about 30% to greater than 40% has been seen with the inventive structures. Moreover, the total outer-fringe capacitance (gate to outer diffusion+gate to contact via) is reduced between 10-18%. The reduction of capacitance is substantial and it represents a significant advance in CMOS device fabrication.

In broad terms, the inventive CMOS structure comprises:

at least one gate region including a gate conductor located atop a surface of a semiconductor substrate; and a low-k dielectric material that is self-aligned to the gate conductor, said low-k dielectric material has a dielectric constant of about 5 or less and is located at least atop said gate conductor.

In some embodiments, the low-k dielectric material is a sleeve that is located atop the gate conductor as well as sidewalls thereof.

The low-k dielectric material employed in the structure comprises any dielectric material that includes atoms of at least Si, C and H. The low-k dielectric material can also optionally include atoms of O, N and/or F. The low-k dielectric material can be a single material layer or it can be comprised of multilayers of low-k dielectric materials.

The inventive structure may further include a stress inducing liner on at least the surface of the semiconductor substrate and contact vias that extend to silicided source/drain regions within said semiconductor substrate.

The present invention is also related to various methods that form the inventive CMOS structure including the self-aligned low-k dielectric material. In accordance with one method of the present invention, the inventive CMOS structure including the self-aligned low-k dielectric material atop at least the gate conductor comprises the steps of:

forming a conformal low-k liner on exposed surfaces of a structure comprising at least one gate region including a gate conductor located atop a surface of a semiconductor substrate, said low-k liner having a dielectric of about 5 or less;

forming a planarized polymeric material on said structure including said conformal low-k liner;

recessing said planarized polymeric material to expose a portion of the structure including the low-k liner atop the gate conductor;

treating the exposed portion to change etching properties thereof;

removing the recessed planarized polymeric material selective to the treated portion;

removing the low-k liner from horizontal surfaces that is not protected with said treated portion; and removing said treated portion to provide a structure including a sleeve around the gate conductor which is comprised of the remaining low-k liner.

In some embodiments, a first metallic film is formed on the low-k liner prior to forming the planarized polymeric material. In this embodiment, the first metallic film is subjected to the treating step.

Another method of the present invention comprises the steps of:

forming a conformal oxide layer on surfaces of a structure including at least a gate conductor located on a surface of a semiconductor substrate;

forming a high density plasma nitride layer on horizontal surfaces of said structure including said conformal oxide layer;

forming a planarized sacrificial material on said structure, wherein said planarized sacrificial material leaves the high density plasma nitride atop the gate conductor exposed;

removing the exposed high densisty plasma nitride to provide a recess that exposes the conformal oxide layer atop the gate conductor;

filling said recess with a low-k dielectric material having a dielectric constant of about 5 or less so that said low-k dielectric material is located atop the gate conductor; and removing the sacrificial polymeric material.

In some embodiments of the present invention, the remaining high density plasma nitride located on the surface of the semiconductor substrate is removed after the sacrificial polymeric material has been removed and another low-k dielectric material is deposited and etched to form a low-k sleeve around the gate conductor, which covers the top and sidewalls thereof.

In either of the methods described above, further CMOS processing such as stress inducing layer formation and via contact formation can be performed.

BRIEF DESCRIPTION OF THE DRAWINGS

FIG. 2A represents a structure including a low-k gate sleeve with a liner and a contact via; and FIG. 2B represents a structure including a low-k gate sleeve with a liner and a borderless contact.

DETAILED DESCRIPTION OF THE INVENTION

Figure 1A:
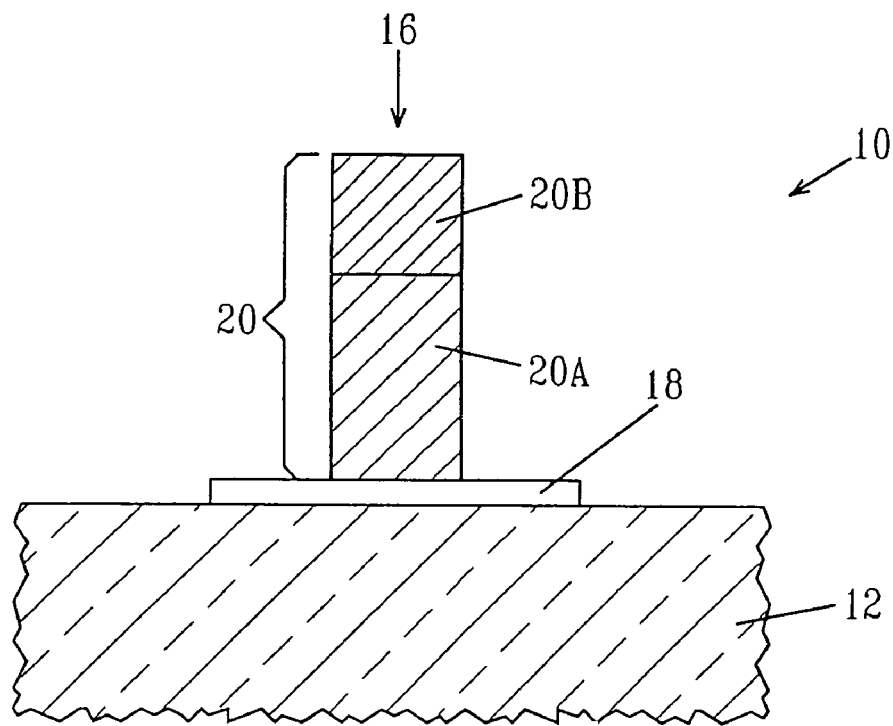
FIGS. 1A-1K are pictorial representations (through cross sectional views) illustrating the basic processing steps employed in one embodiment of the present invention.

The present invention, which provides a CMOS structure including at least a low-k gate cap which reduces the gate-to-drain/source capacitance as well as methods of fabricating the same, will now be described in greater detail by referring to the drawings that accompany the present application. It is noted that the drawings are provided for illustrative purposes and thus they are not drawn to scale.

Reference is first made to FIGS. 1A-1K which illustrates a first embodiment of the present invention for fabricating a CMOS structure including a low-k gate sleeve that is self-aligned with the previously formed gate conductor.

FIG. 1A illustrates the initial structure 10 that is employed in this embodiment of the present invention. As illustrated, the structure 10 includes a semiconductor substrate 12 that has at least one gate region 16 that is located on a surface of the semiconductor substrate 12. Each gate region, i.e., 16, includes a gate dielectric 18 and a gate conductor 20. In the embodiment shown, gate conductor 20 includes a lower portion 20A and an upper portion 20B. The one gate region 16 is provided for illustrative purposes and thus the present invention is not limited to only a single gate region. Instead, the present invention works when the substrate includes a plurality of gate regions.

The semiconductor substrate 12 of structure 10 comprises any semiconducting material including, but not limited to: Si, Ge, SiGe, SiC, SiGeC, Ga, GaAs, InAs, InP and all other III/V compound semiconductors. Semiconductor substrate 12 may also comprise an organic semiconductor or a layered semiconductor such as Si/SiGe, a silicon-on-insulator (SOI) or a SiGe-on-insulator (SGOI). In some embodiments of the present invention, it is preferred that the semiconductor substrate 12 be composed of a Si-containing semiconductor material, i.e., a semiconductor material that includes silicon. The semiconductor substrate 12 may be doped, undoped or contain doped and undoped regions therein.

The semiconductor substrate 12 may also include a first doped (n- or p-) region, and a second doped (n- or p-) region. For clarity, the doped regions are not specifically labeled in the drawings of the present application. The first doped region and the second doped region may be the same, or they may have different conductivities and/or doping concentrations. These doped regions are known as "wells".

Trench isolation regions (not shown) are typically already formed in the semiconductor substrate 12 at this point of the present invention utilizing conventional processes well known to those skilled in the art. The trench isolation regions are typically formed utilizing trench isolation techniques that are well known in the art including, for example, forming a patterned mask on the surface of the substrate via lithography, etching a trench into the substrate thru an opening in the patterned mask, filling the trench with a trench dielectric such as $SiO_2$ or TEOS and planarizing the structure. An optional trench liner can be formed within the trench prior to trench dielectric fill and an optional densification step may follow the planarization process.

A gate dielectric 18 is formed on the entire surface of the structure 10 including the semiconductor substrate 12 and atop the isolation region, if it is present and, if it is a deposited dielectric. The gate dielectric 18 can be formed by a thermal growing process such as, for example, oxidation, nitridation or oxynitridation. Alternatively, the gate dielectric 18 can be formed by a deposition process such as, for example, chemical vapor deposition (CVD), plasma-assisted CVD, atomic layer deposition (ALD), evaporation, reactive sputtering, chemical solution deposition or other like deposition processes. The gate dielectric 18 may also be formed utilizing any combination of the above processes.

The gate dielectric 18 is comprised of an insulating material including, but not limited to: an oxide, nitride, oxynitride and/or silicate including metal silicates and nitrided metal silicates. In one embodiment, it is preferred that the gate dielectric 18 is comprised of an oxide such as, for example, $SiO_2$, $HfO_2$, $ZrO_2$, $Al_2O_3$, $TiO_2$, $La_2O_3$, $SrTiO_3$, $LaAlO_3$, and mixtures thereof.

The physical thickness of the gate dielectric 18 may vary, but typically, the gate dielectric 18 has a thickness from about 0.5 to about 10 nm, with a thickness from about 0.5 to about 3 nm being more typical.

After forming the gate dielectric 18, a blanket layer of polysilicon or another gate conductor material or combination thereof, which becomes the gate conductor 20 shown in FIG. 1A, is formed on the gate dielectric 18 utilizing a known deposition process such as, for example, physical vapor deposition, CVD or evaporation. The blanket layer of gate conductor material may be doped or undoped. If doped, an in-situ doping deposition process may be employed in forming the same. Alternatively, a doped gate conductor layer can be formed by deposition, ion implantation and annealing. The doping of the gate conductor layer will shift the workfunction of the gate formed. Illustrative examples of dopant ions include As, P, B, Sb, Bi, In, Al, Ga, Ti or mixtures thereof. Typical doses for the ion implants are 1E14 ($=1\times10^{14}$) to 1E16 ($=1\times10^6$) atoms/cm$^2$ or more typically 1E15 to 5E15 atoms/cm$^2$. The thickness, i.e., height, of the gate conductor layer deposited at this point of the present invention may vary depending on the deposition process employed. Typically, the gate conductor layer has a vertical thickness from about 20 to about 180 nm, with a thickness from about 40 to about 150 nm being more typical.

The gate conductor 20 can comprise any conductive material that is typically employed as a gate of a CMOS structure. Illustrative examples of such conductive materials that can be employed as the gate conductor 20 include, but are not limited to: polysilicon metals or metal alloys, suicides, conductive nitrides, polySiGe and combinations thereof, including multilayers thereof. In the drawing, an embodiment is shown in which the gate conductor 20 comprises a lower region of polysilicon 20A and an upper region comprising a metal silicide 20B. The metal silicide is formed utilizing a conventional silicidation process well known to those skilled in the art. In some embodiments, it is possible to form a barrier layer between multiple layers of gate conductors.

An optional dielectric cap (not shown) can be formed atop the gate conductor 20 at this point of the present invention. The optional dielectric cap is typically removed before or immediately after the source/drain regions have been silicided.

The blanket gate conductor 20 is then patterned by lithography and etching so as to provide patterned gate stacks. The patterned gate stacks may have the same dimension, i.e., length, or they can have variable dimensions to improve device performance. Each patterned gate stack at this point of the present invention includes at least the gate conductor 20. The lithography step includes applying a photoresist to the upper surface of the gate conductor 20, exposing the photoresist to a desired pattern of radiation and developing the exposed photoresist utilizing a conventional resist developer. The pattern in the photoresist is then transferred to the blanket layer of gate conductor 20 utilizing one or more dry etching steps. In some embodiments, the patterned photoresist may be removed after the pattern has been transferred into the blanket layer of gate conductor 20.

Suitable dry etching processes that can be used in the present invention in forming the patterned gate stacks include, but are not limited to: reactive ion etching, ion beam etching, plasma etching or laser ablation. The dry etching process employed is typically selective to the underlying gate dielectric 18 therefore this etching step does not typically remove the gate dielectric (see FIG. 1A). In some embodiments (not shown), this etching step may however be used to remove portions of the gate dielectric 18 that are not protected by the gate stacks. A wet etching process can also be used to remove portions of the gate dielectric 18 that are not protected by the gate stacks.

At least one spacer 24 is formed on exposed sidewalls of each patterned gate stack. The at least one spacer 24 is comprised of an insulator such as an oxide, nitride, oxynitride and/or any combination thereof. Preferably, oxide inner spacers are formed and nitride outer spacers are formed. The at least one spacer 24 is formed by deposition and etching.

The width of the at least one spacer 24 must be sufficiently wide enough such that the source and drain silicide contacts (to be subsequently formed) do not encroach underneath the edges of the gate stack. Typically, the source/drain silicide does not encroach underneath the edges of the gate stack when the at least one spacer has a width, as measured at the bottom, from about 15 to about 80 nm.

After spacer formation, source/drain diffusion regions 14 are formed into the substrate 12. The source/drain diffusion regions 14 are formed utilizing ion implantation and an annealing step. The annealing step serves to activate the dopants that were implanted by the previous implant step. The conditions for the ion implantation and annealing are well known to those skilled in the art. In the present invention, the phrase "source/drain diffusion regions" includes extension regions, halo regions and deep source/drain regions.

Figure 1B:
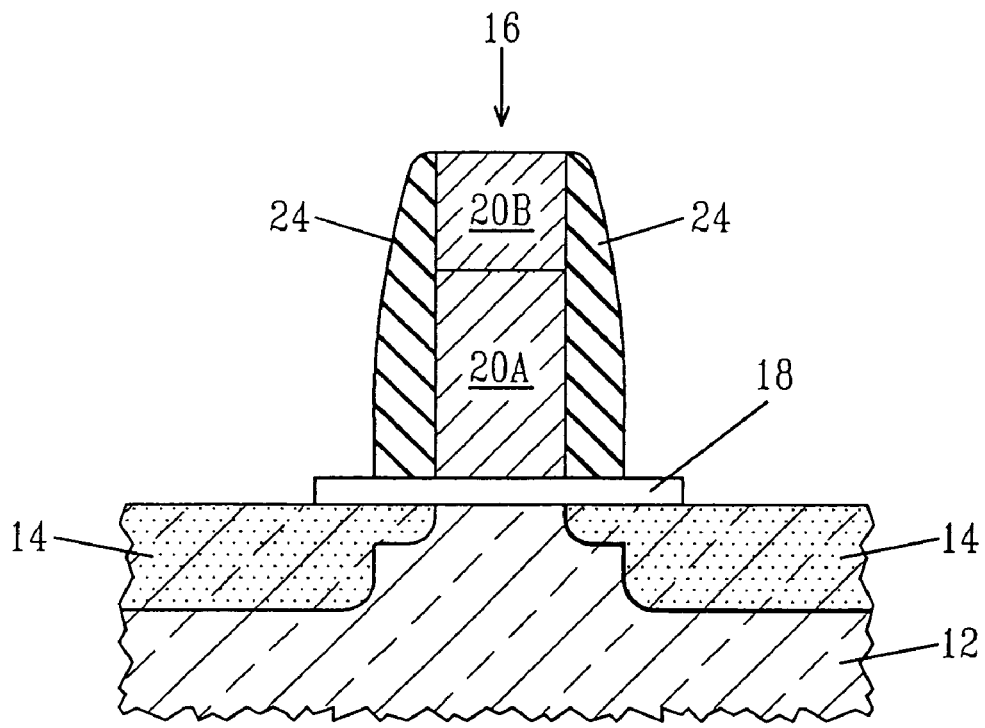

The structure formed after forming the at least one spacer 24 and the source/drain diffusion regions 14 is shown, for example, in FIG. 1B.

In some embodiments of the present invention and when the substrate does not include silicon, a Si-containing layer can be formed atop of the exposed portions of the substrate to provide a source for forming the silicide contacts. Illustrative examples of Si-containing materials that can be used include, for example, Si, single crystal Si, polycrystalline Si, SiGe, and amorphous Si. This embodiment of the present invention is not illustrated in the drawings.

Figure 1C:
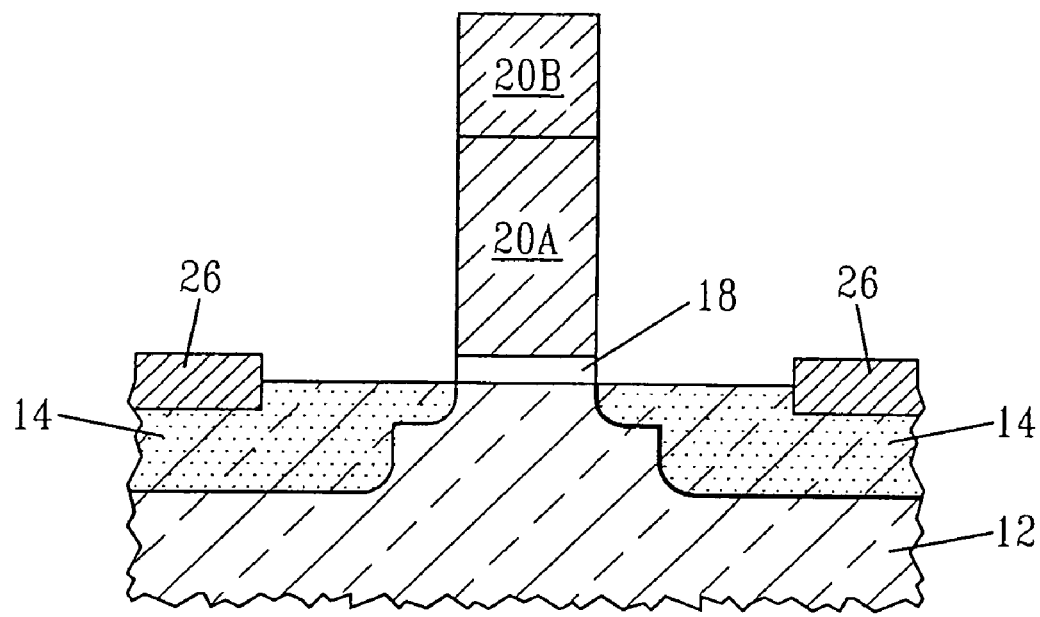

Next, the source/drain diffusion regions 14 are silicided utilizing a standard salicidation process well known in the art. This includes forming a metal capable of reacting with Si atop the entire structure, forming an oxygen barrier layer atop the metal, heating the structure to form a silicide, removing non-reacted metal and the oxygen barrier layer and, if needed, conducting a second heating step. The second heating step is required in those instances in which the first heating step does not form the lowest resistance phase of the silicide. In FIG. 1C, reference numeral 26 denotes the silicided source/drain regions. Note that if the gate conductor 20 is comprised of polysilicon or SiGe, this step of the present invention can be used in forming a metal silicide atop the Si-containing gate conductor.

After forming the silicided source/drain regions 26, the at least one spacer 24 is removed from the structure utilizing an etching process that selectively removes the at least one spacer 24. In the embodiment shown, the outer nitride spacer can be removed by hot phosphoric acid or another suitable etchant, while the inner oxide spacer is removed in an HF solution. The structure with silicided source/drain regions 26 and without the at least one spacer 24 is shown, for example, in FIG. 1C. Note during this step of the present invention a portion of the gate dielectric 18 not protected by the gate conductor 20 is removed. Also, the optional dielectric cap mentioned above could be removed here as well.

A low-k liner 28 is then conformally formed around the gate conductor 20 and on the surface of substrate 12. The term "low-k" as used with liner 28 denotes a dielectric constant that is about 5.0 or less, preferably less than 4.0, and more preferably less than 3.5. All dielectric constants mentioned in the present application are relative to a vacuum unless otherwise noted. The low-k liner 28 is comprised of any dielectric material that comprises at least atoms of Si, C, and H. The low-k liner 28 may optionally include O, N, and/or F. The low-k liner 28 may be porous or non-porous, with non-porous being highly preferred. The low-k liner 28 may comprise a single dielectric material or it may comprise multilayers of low-k dielectrics.

A preferred low-k dielectric material used in the present invention is one that includes atoms of Si, C and U ("SiCH"). The preferred dielectric SiCH has a dielectric constant from about 3 to about 5, depending on the mole fraction ratio between C and Si. In some embodiments in which the preferred dielectric material comprising atoms of Si, C and H is employed, the preferred dielectric material SiCH can be covered with another low-k dielectric material such as a dielectric material having atoms of Si, C, O and H ("SiCOH"). The dielectric constant for SiCOH dielectrics is from about 2.4 to about 3.5 depending upon the mole fraction of Si, C and O.

The low-k liner 28 is formed utilizing any conformal deposition process including, for example, spin-on coating, plasma-enhanced chemical vapor deposition (PECVD), chemical vapor deposition (CVD), high-density plasma (HDP) deposition, pulsed PECVD, or other related methods that can form a conformal low-k liner. In embodiments in which the low-k liner 28 is comprised of multilayered dielectrics, the multilayered dielectrics can be formed in the same or different process chamber. For example, when the conformal low-k liner 28 includes a graded oxygen content from SiCH to SiCOH, the liner 28 can be deposited in one process chamber with gradual increased flow of oxygen-containing precursor with a diffused boundary between SiCH to SiCOH, or it can be deposited in different process chambers with distinct conditions yielding a clear boundary between the low-k dielectric films.

The thickness of the low-k liner 28 deposited at this point of the present invention may vary; a typical range for the low-k liner 28 is from about 50 to about 1000 Å, with a thickness from 100 to about 250 Å being more typical.

Figure 1D:
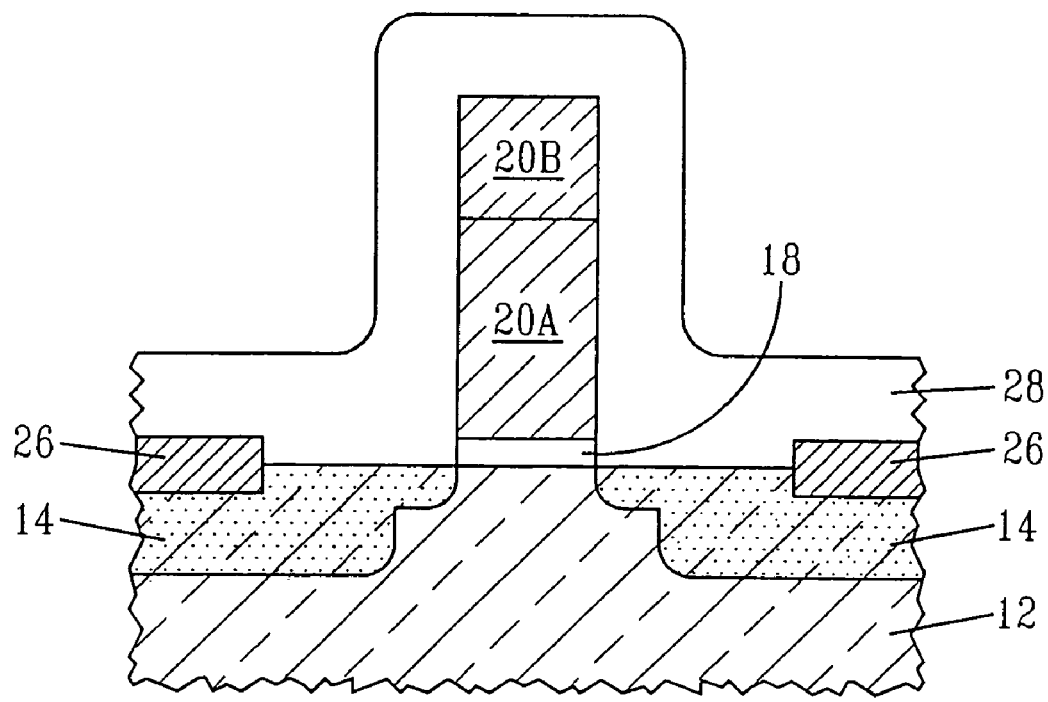

The structure including the low-k liner 28 is shown, for example, in FIG. 1D. As shown and as stated above, the low-k liner 28 is located around the gate conductor 20 and on top of the substrate 12.

Figure 1E:
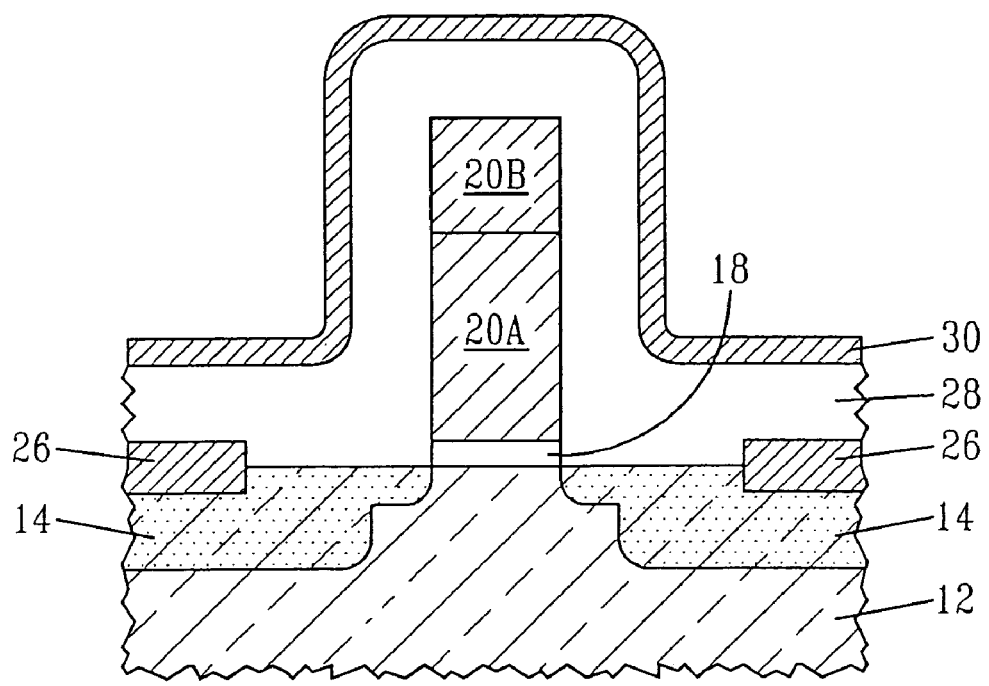

Next, and as shown, for example, in FIG. 1E, a first metallic film 30 is optionally formed on the exposed surface of the low-k liner 28. The first metallic film 30 is comprised of a metal such as, for example, Ti, Ta, W, or alloys thereof. Titanium is a preferred metal for the first metallic film 30. The first metallic film 30 is a thin layer whose thickness is from about 5 to about 50 nm, with a thickness from about 5 to about 20 nm being more typical.

The first metallic film 30 is formed utilizing a conventional deposition process that can form a conformal layer of metal on a structure. For example, physical vapor deposition (PVD), CVD, or PECVD can be employed in forming the first metallic film 30. The first metallic film 30 is typically formed utilizing a low deposition temperature that is typically below 400° C.

As stated above, this step is optional can thus can be skipped in some embodiments of the present invention. When the first metallic film 30 is not formed, a portion of the low-k liner 28 can be converted into an etch stop layer during a subsequent processing step of the present invention. The omission of this step eliminates a need for explicitly including deposition of an extra film. Accordingly, the surface portion of the low-k liner 28 can be modified by nitridation, oxidation, silicidation or ion implantation to form an etch mask.

Figure 1F:
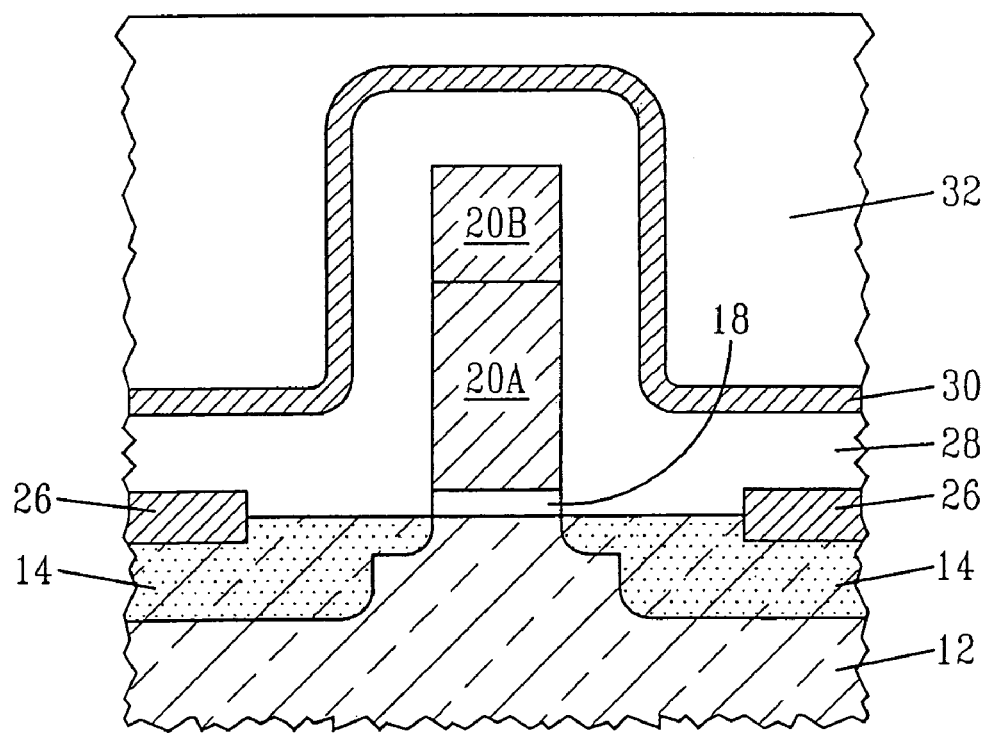

The structure shown in FIG. 1E is then coated with a polymeric material 32 and planarized providing the structure shown, for example, in FIG. 1F. As shown, the polymeric material 32 covers the optional first metallic film 30, if present, or the low-k liner 28 if the first metallic film 30 is not present. The polymeric material is formed by any deposition process including, for example, spin-on coating, CVD or PECVD. The polymeric material 32 can be a conventional antireflective coating (ARCs), a spin-on glass (SOG) material or a conventional photoresist. SOG materials are particularly advantageous since they can withstand a higher temperature than typical organic polymers. It is noted that the polymeric material 32 employed should be stable up to a temperature of about 500° C. The thickness of the polymeric material 32 deposited can vary. Typically, the polymeric material 32 has a thickness from about 50 to about 150 nm.

After depositing the polymeric material 32, the polymeric material 32 is planarized utilizing a conventional planarization process such as, for example, chemical mechanical polishing (CMP), grinding or a combination thereof.

Figure 1G:
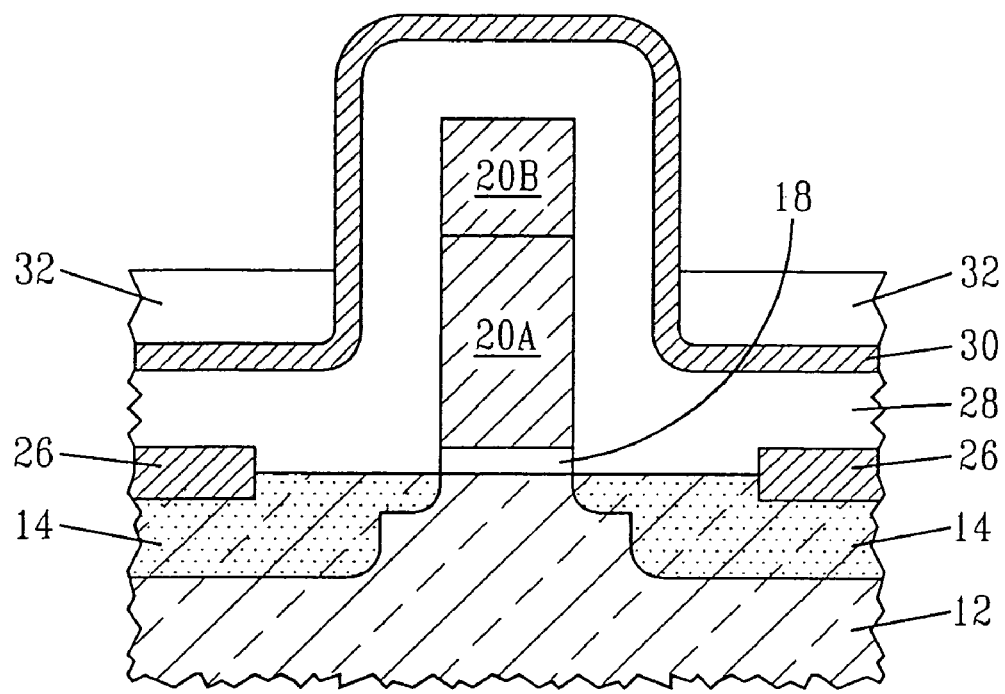

The polymeric material 32 is then recessed using reactive ion etching (RIE) or another like etching process that can recess polymeric material. The depth of the recess can vary, but typically the polymeric material 32 is recessed to about half of the gate conductor 20 height. The resultant structure that is formed after the recessing step has been performed is shown in FIG. 1G. As shown, the recessing step exposes a top portion of first metallic layer 30, if present, or a top surface of the low-k liner 28, if the low-k liner 30 is not present.

Figure 1H:
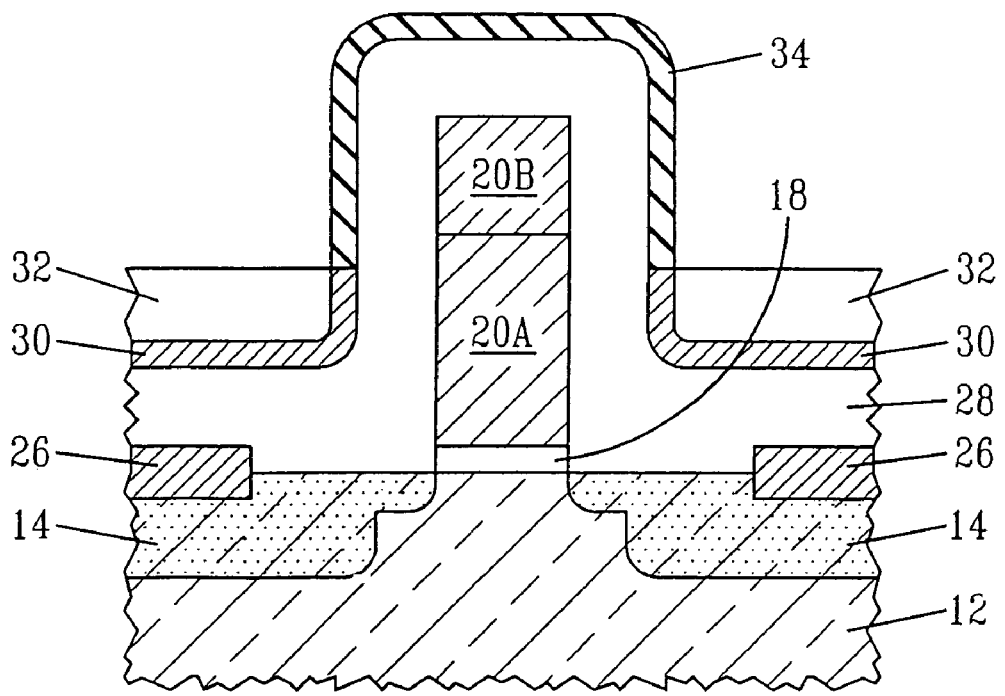
Figure 1I:
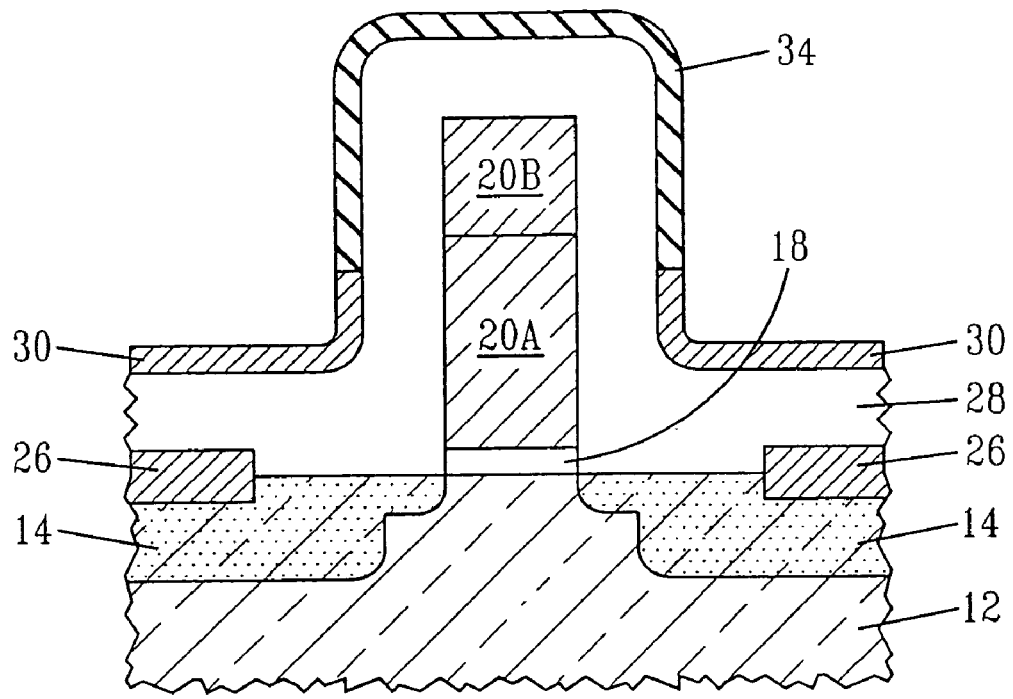

Next, and as shown in FIG. 1H, the exposed surface of either the first metallic layer 30 or the low-k liner 28 (this embodiment is not shown in the drawings) is converted into a material that has different etch properties as compared with the original material. The material with different etch properties is labeled by reference numeral 34 in FIG. 1H. The material with different etch properties 34 can be formed by nitridation, silicidation, oxidation, ion implantation, annealing or combinations thereof.

In one embodiment in which a surface portion of the first metallic layer 30 is exposed, a plasma nitridation process is employed which converts the exposed portion of the metallic film to a metal nitride, e.g., Ti is converted into TiN. In another embodiment, the first metallic film 30 that is exposed can be converted into a silicide by first forming a silicon-containing material on the exposed first metallic film 30 and then annealing so as to cause interaction between Si and metal and subsequent formation of a metal silicide. In yet another embodiment in which a surface of the low-k liner 28 was exposed by the recessing step, this step of the present invention can convert the exposed low-film to an oxide, nitride, oxynitride or silicide.

After providing the structure illustrated in FIG. 1H, the recessed polymeric material 32 is removed from the structure utilizing an etching step that selectively removes the polymeric material. For example, the removal of the recessed polymeric material 32 can be performed by utilizing an organic solvent. The structure that is formed after the recessed polymeric material 32 has been removed is shown, for example, in FIG. 1I.

Figure 1J:
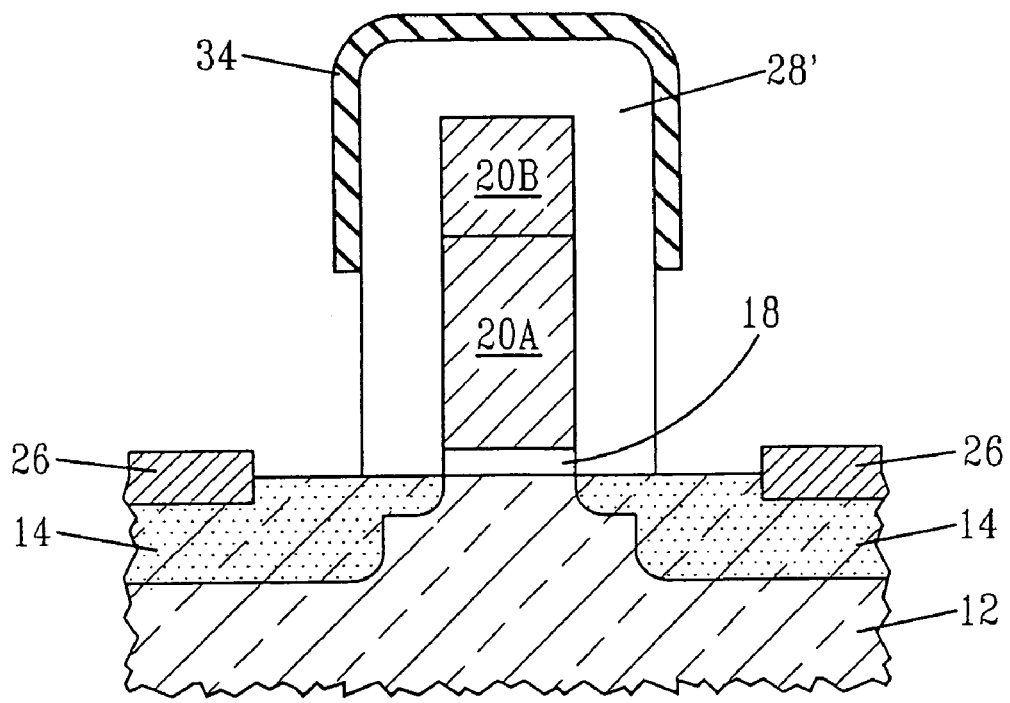

Next, the remaining first metallic film 30 and the exposed portion of the low-k liner 28 (not protected with treated material 34) are then removed from horizontal surfaces selective to the treated material 34. A single etching step or a two-step etching process can be used. For example, the remaining first metallic film 30 is first removed selective to the treated material 34 and then the underlying low-k liner 28 is removed by a directional etch that is also selective to the treated material 34. The resultant structure is shown in FIG. 1J. In the illustrated structure, the remaining low-k liner 28 is referred to a low-k sleeve 28'.

Figure 1K:
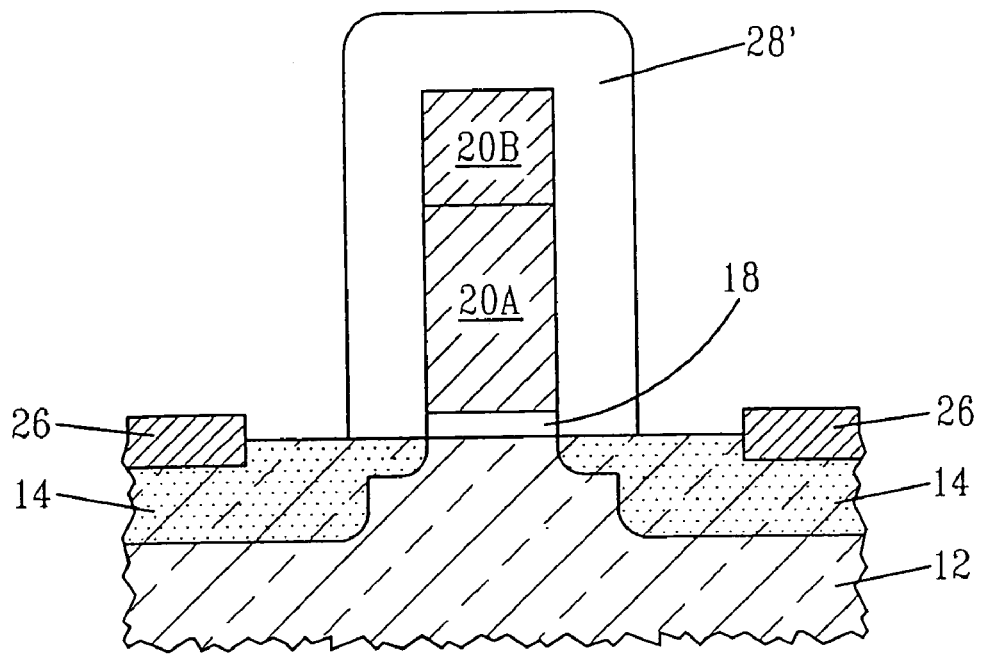

The remaining treated material 34 located on the low-k sleeve 28' is then removed using a solution containing an oxidizing agent such as hydrogen peroxide so as to provide the structure shown in FIG. 1K. Optionally, the remaining treated material 34 may be allowed to remain on the low-k sleeve 28'.

Figure 2A:
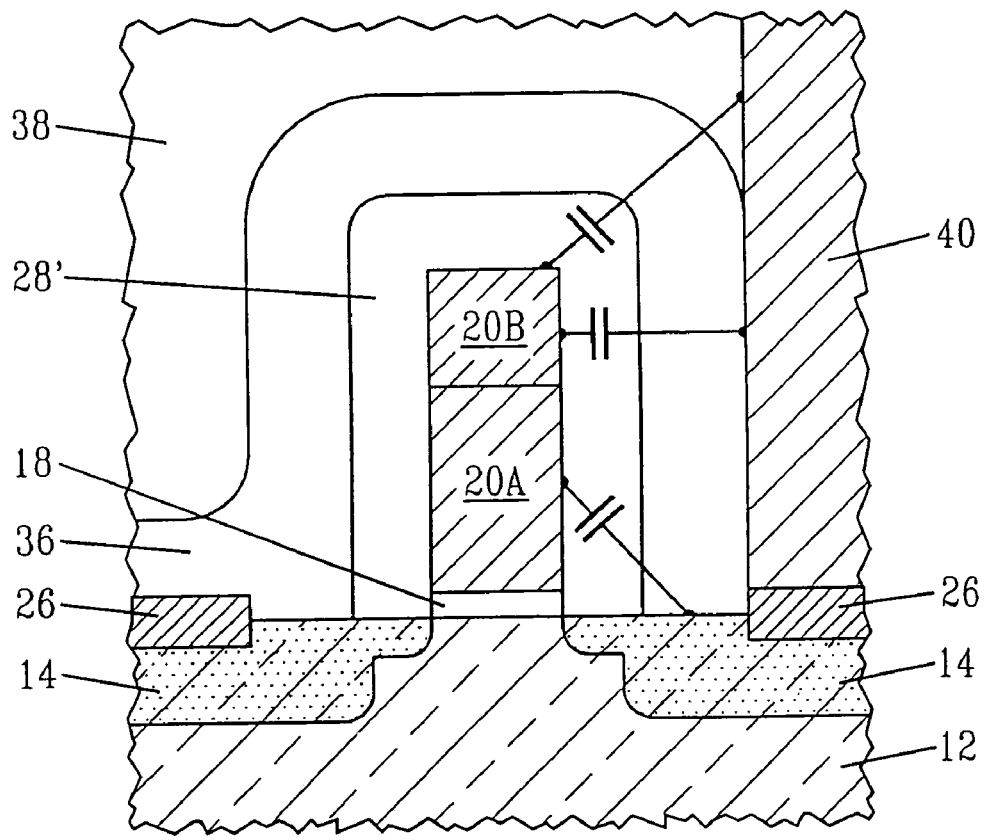
FIGS. 2A-2B are pictorial representations (through cross sectional views) illustrating the structure of FIG. 1K after stress liner and contact via formation.
Figure 2B:
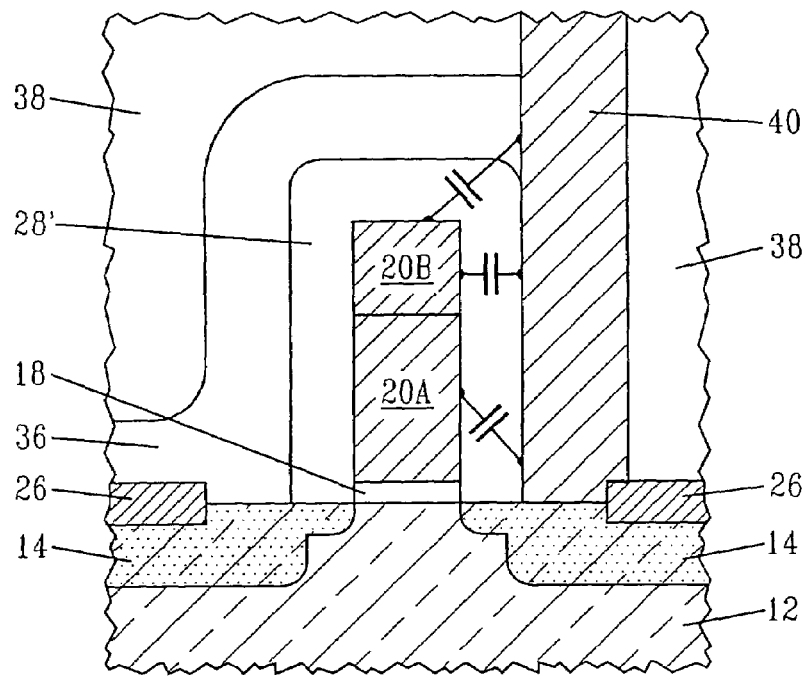

FIGS. 2A-2B illustrate structures that can be formed utilizing further CMOS processing steps. In particular, FIG. 2A illustrates the structure of FIG. 1K after an overlying stress inducing liner 36 and a contact via 40 are formed. Despite showing the formation of a single contact via 40, the present invention also contemplates forming a contact via to the other silicided source/drain region and to the top of the gate conductor 20, where required; these other contact vias are not shown for clarity. The overlying stress inducing liner 36 comprises a material that has a built in stress with respect to the underlying semiconductor substrate 12. Illustrative examples of such stress inducing materials include, for example, $Si_3N_4$, $SiO_2$ and multilayers thereof. The stress inducing liner 36 is formed utilizing a conventional deposition process such as CVD or PECVD. The contact via 40 is formed by first forming a dielectric material 38 such as a SOG and then forming an opening in the dielectric material 38 that extends to the silicided source/drain regions 26. The opening is then filled with a conductive metal such as Cu, W, Al, Ti and the like and then the structure is planarized. In FIG. 2A, the symbol for a capacitor is included to shown the components of capacitance in the structure.

The structure shown in FIG. 2B is similar to that shown in FIG. 2A expect that the contact via 40 is borderless.

Figure 3:
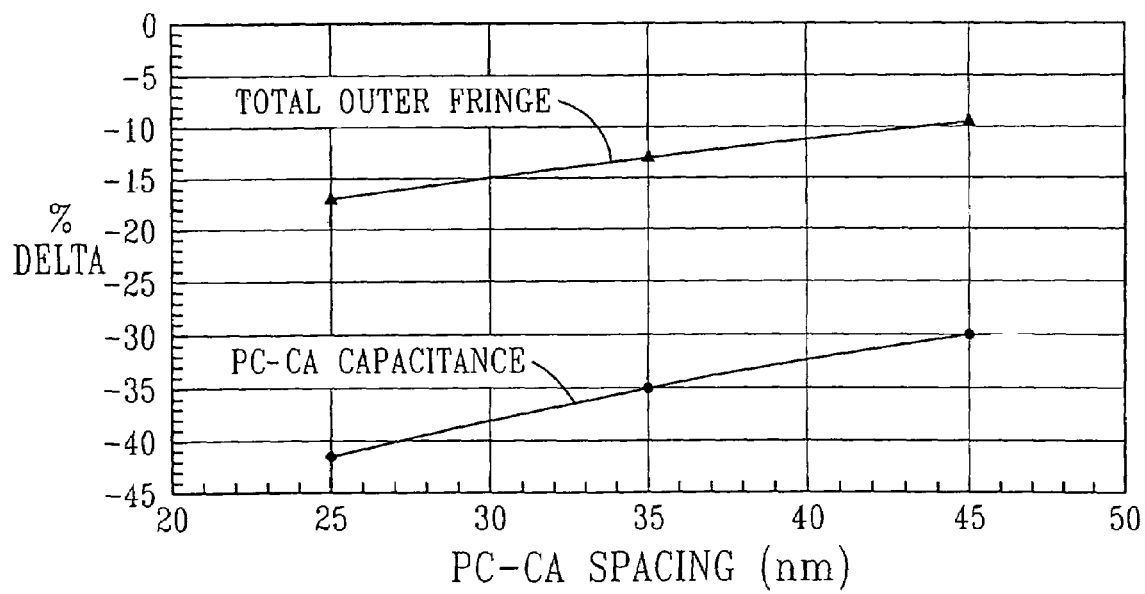
FIG. 3 is a plot showing the % change in capacitance that can result from the inventive structure using 3D finite-element modeling.

As indicated above, the inventive structure shown in FIGS. 1K, 2A and 2B has reduced capacitance. The reduced capacitance has been quantified with 3D finite-element modeling. The reduction in capacitance between the gate conductor 20 and the contact via 40 is very substantial, and ranges from 30% to greater than 40%, depending on the specific geometry. This is shown, for example, in FIG. 3; (PC=Gate Conductor, CA=Via Contact). In this drawing, the total outer-fringe capacitance (gate to outer diffusion+gate to contact via) is reduced about 10% to about 18% by the inventive structure.

In the inventive structure, the low-k sleeve 28' continuously covers all surfaces of the gate conductor 20: from the sides and the top. This is opposed to conventional gate spacers in which only the sidewalls of the gate conductor are covered. The inventive structure including the low-k sleeve 28' shields the gate conductor 20 from undesirable capacitive coupling from all sides, including the top of the gate. The low-k sleeve also provides flexibility in allowing effective source/drain engineering because these regions are free of the gate sleeve material. For instance, the sleeve can be easily combined with local stress engineering (as described above). In addition, the gate sleeve can be used for forming a borderless contact (as also described above) if the interlayer gate dielectric 38 etches more rapidly than the low-k material. A borderless source/drain contact increases circuit package density while improving manufacturing yields by eliminating contact-to-gate electrical shorts.

Figure 4A:
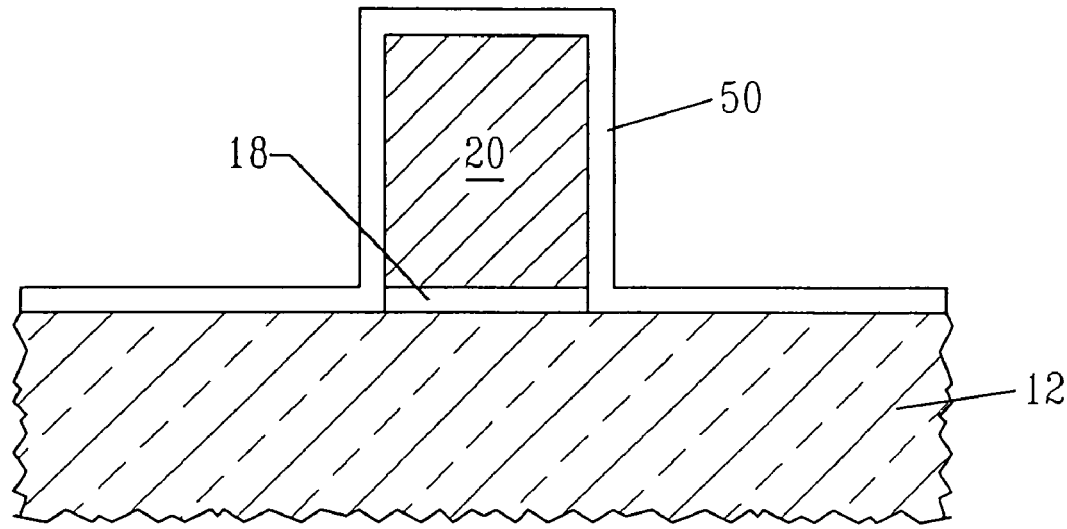
FIGS. 4A-4J are pictorial representations (through cross sectional views) illustrating the basic processing steps employed in another embodiment of the present invention.

Reference is now made to FIGS. 4A-4J which illustrates a second embodiment for forming the inventive structure that includes the low-k material round the gate conductor. This embodiment begins by first providing the structure shown in FIG. 1C. It is noted that in this embodiment of the present invention, the drawings have been simplified from those shown in FIGS. 1A-1J to illustrate the key elements of the invention. FIG. 4A shows the structure that is formed after a conformal oxide liner 50 has been formed on all exposed surfaces of the structure shown in FIG. 1C. The oxide liner 50 is formed by any suitable deposition process that can provide conformal coverage. For example, CVD, PECVD or PVD can be employed in forming the oxide liner 50. The oxide liner 50 is a thin layer whose thickness is typically from about 1 to about 20 nm, with a thickness from about 5 to about 10 nm being more typical.

Figure 4B:
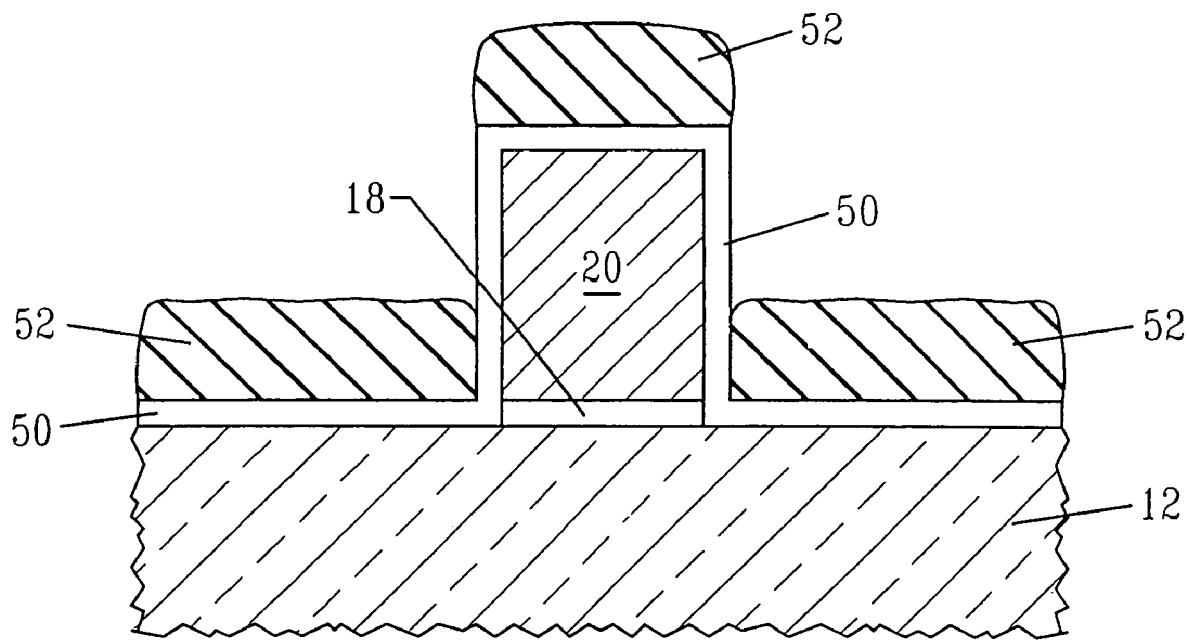
Figure 4C:
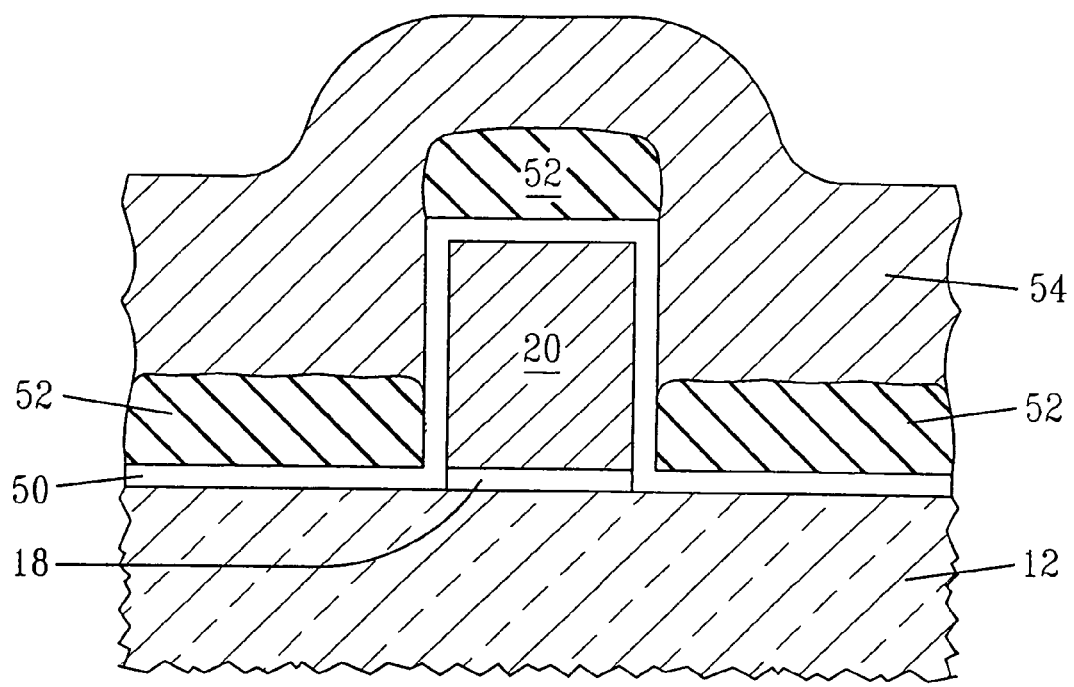
Figure 4D:
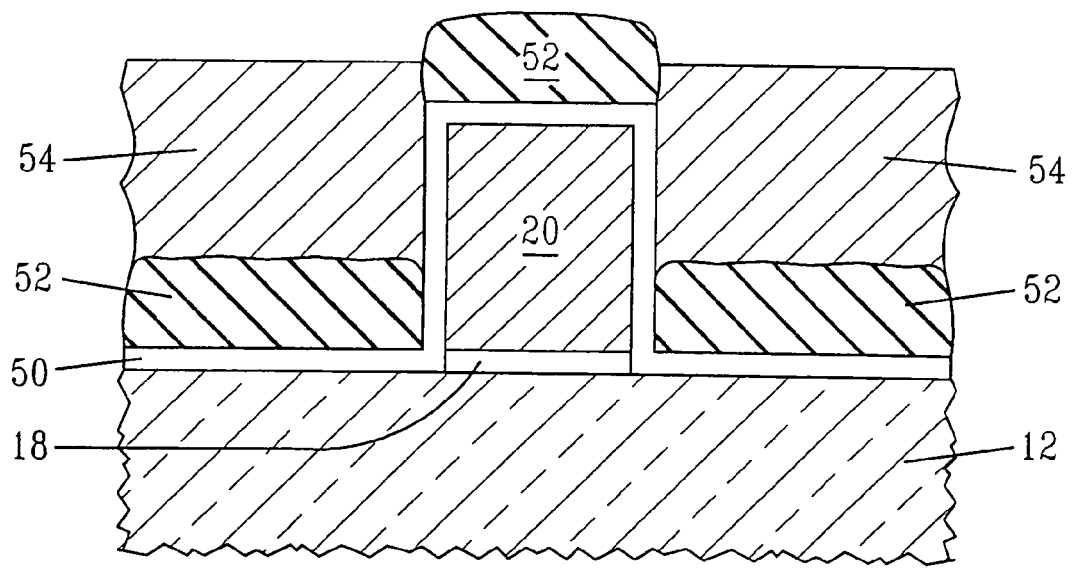

Next, a layer of high density plasma silicon nitride 52 is formed on primarily all exposed horizontal surfaces of the structure shown in FIG. 4B providing the structure shown in FIG. 4C. The thickness of the layer of high density silicon nitride 52 determines the thickness of the self-aligned low-k insulated cap. Typical ranges for the thickness of layer 52 is from about 5 to about 50 nm.

After forming the high density plasma silicon nitride layer 52, a sacrificial material 54 such as polysilicon is formed by deposition providing the structure shown in FIG. 4C. The sacrificial material 54 is formed by any conventional deposition process including, for example, CVD or PECVD. The structure shown in FIG. 4C is then subjected to a planarization process such as chemical mechanical polishing that is selective to nitride such that the layer of high density plasma nitride 52 atop the gate conductor 20 is exposed. Optionally, the sacrificial material 54 can be slightly recessed below the upper surface of high density plasma layer 52 covering the gate conductor 20. The resultant structure that is formed after the planarization process has been performed is shown, for example, in FIG. 4D.

The exposed high density plasma nitride layer 52 atop the gate conductor 20 is then removed utilizing a selective etching process to expose a surface portion of oxide liner 50 that is on an upper surface of the gate conductor 20. See FIG. 4E. Specifically, the removal of the exposed portion of layer 52 is achieved in the present invention utilizing a hot acid etching process.

Figure 4E:
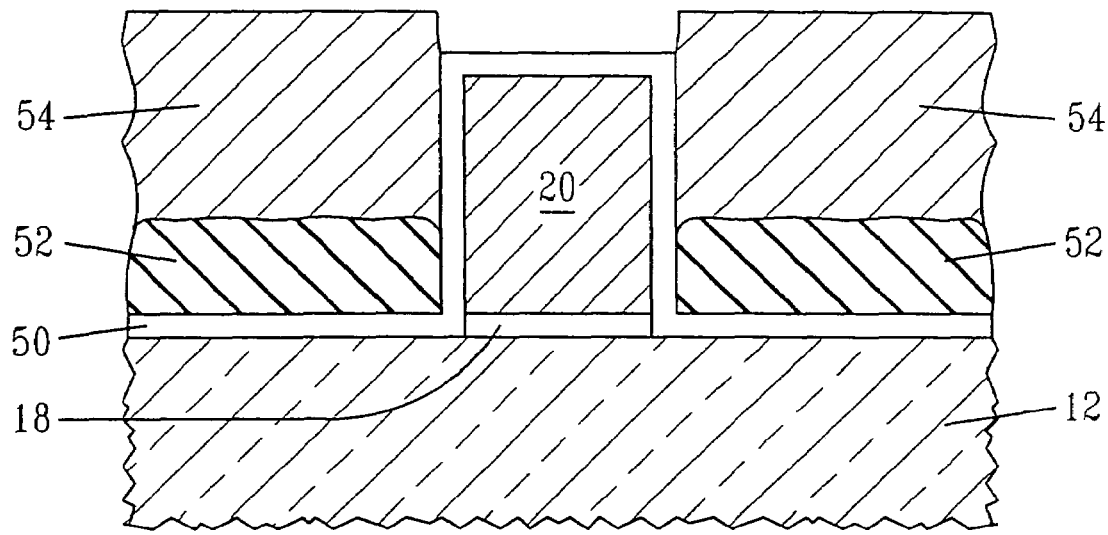
Figure 4F:
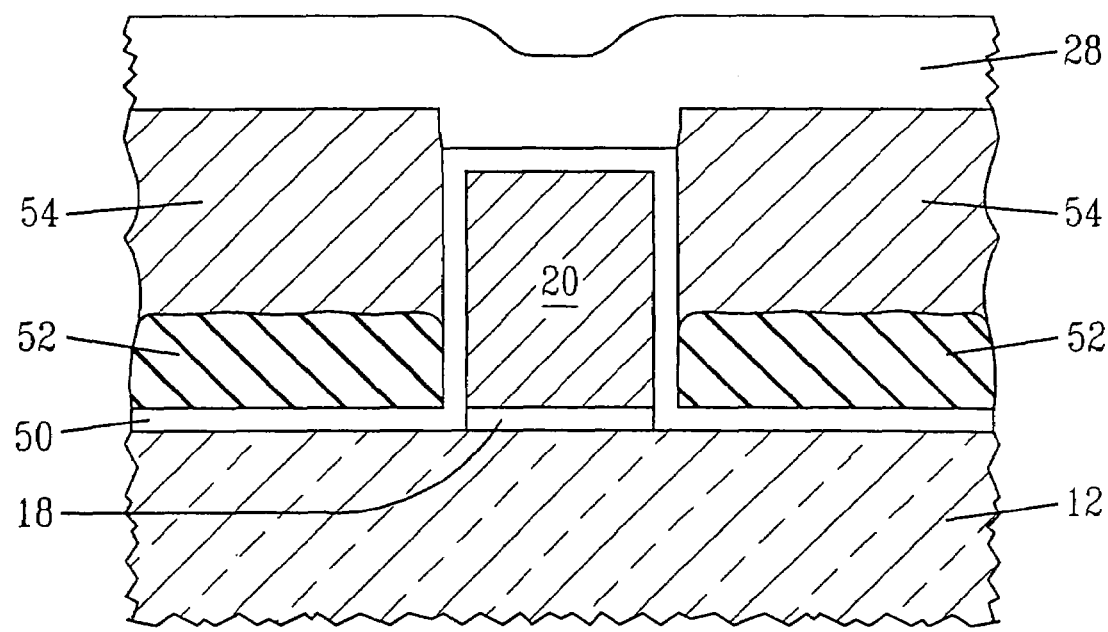

A layer of low-k material 28 is then formed on all exposed surfaces of the structure shown in FIG. 4E providing the structure shown in FIG. 4F. Note that the low-k material 28 is the same as that used in forming low-k liner 28. Hence, the above description concerning the low-k liner is applicable here in this embodiment of the present invention and thus it is incorporated herein by reference. As shown, the low-k material 28 is deposited such as to cover the surface of the sacrificial material 54 and fill the recess left by the removal of the high density plasma nitride 52 from atop the gate conductor 20.

Figure 4G:
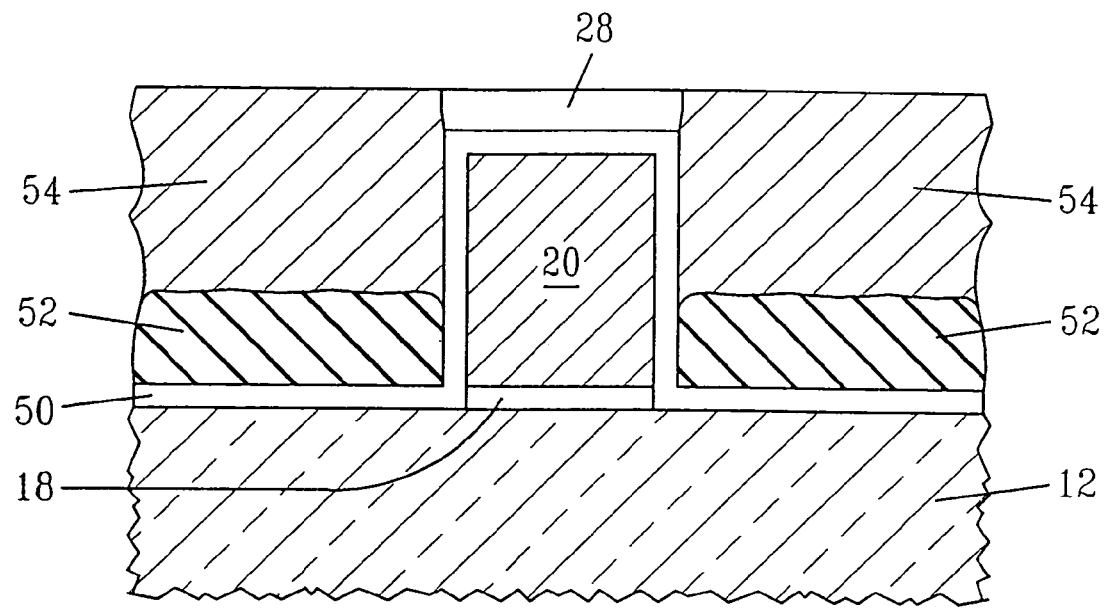

The low-k material 28 is then planarized by chemical mechanical polishing or another suitable planarization process so as to provide the planarized structure shown in FIG. 4G. Note that low-k material remains only atop the gate conductor 20 after this planarization step.

Figure 4H:
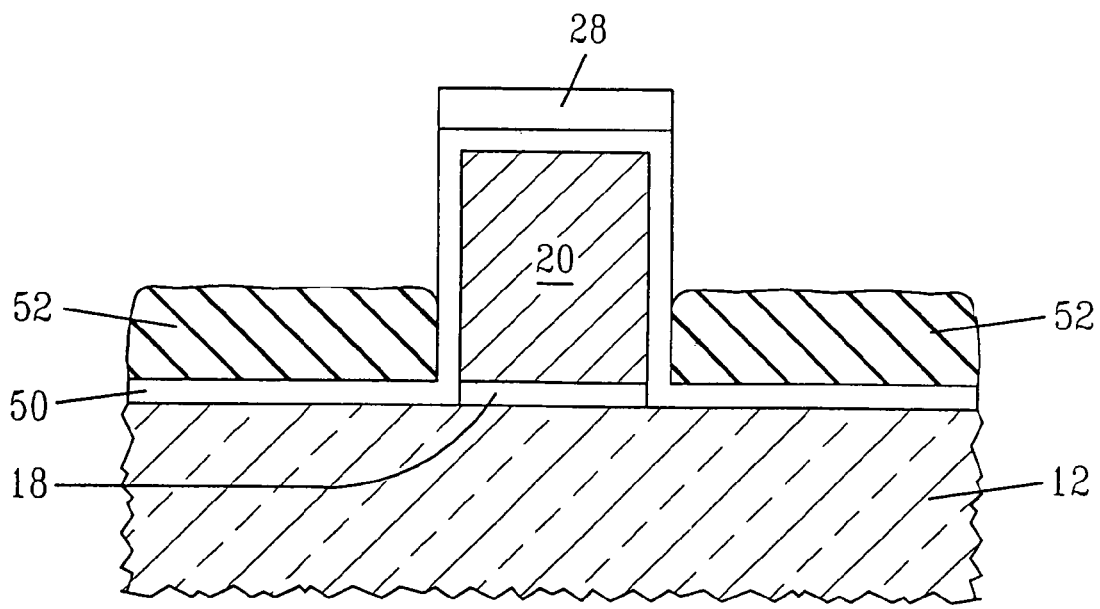
Figure 4I:
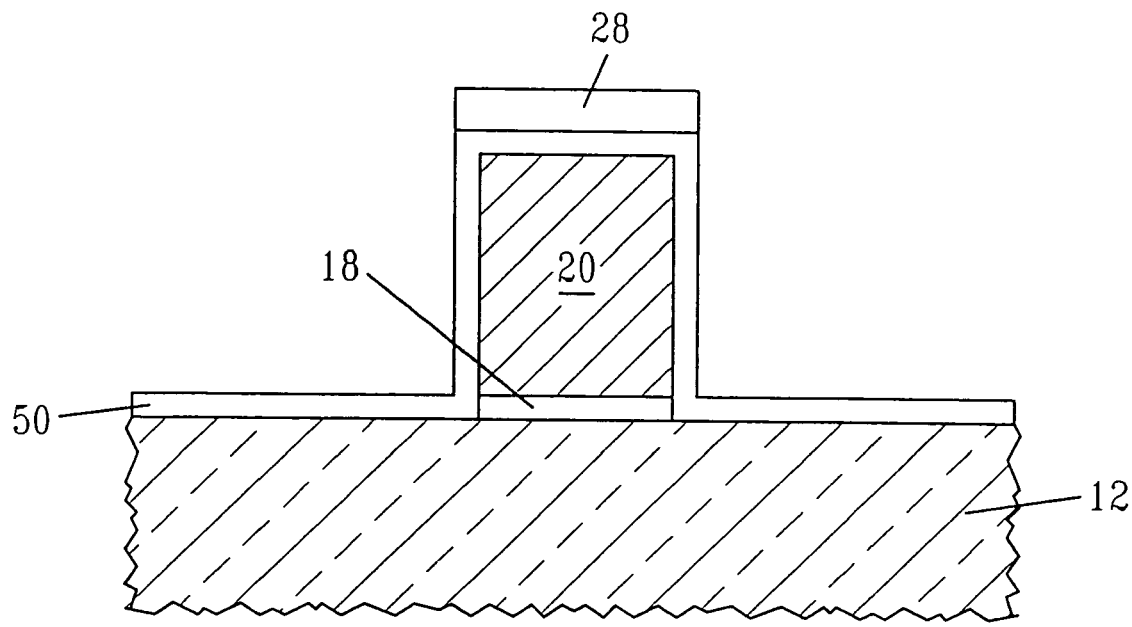

Next, and as illustrated in FIG. 4H, the sacrificial material 54 is removed selective to the low-k material 28, preferably utilizing a dry or wet isotropic etching process. As shown, low-k material 28 remains atop the gate conductor 20, while high density plasma nitride 52 remains atop the substrate 12. The remaining high density plasma nitride 52 can be optionally removed at this point of the present invention or it can remain in the structure as a stress inducing layer. When the remaining high density plasma nitride 52 is removed, an etching process that is selective to the low-k material 28 is employed. An example of such a selective etch that can be used at this point of the inventive process includes chemistry including fluorine such as $CHF_3$. FIG. 4I shows the structure after the remaining high density plasma nitride layer 52 has been removed. It is noted that the structure shown in FIG. 4I including the low-k dielectric cap 28 atop the gate conductor 20 can be used to reduce the gate-to-drain/source capacitance. Alternatively, another layer of low k material can be deposited and etched to form spacers 29; See FIG. 4J. In this structure, the low-k cap 28 and the low-k spacers 29 form a low-k sleeve 28' like in the first embodiment of the present invention.

Figure 4J:
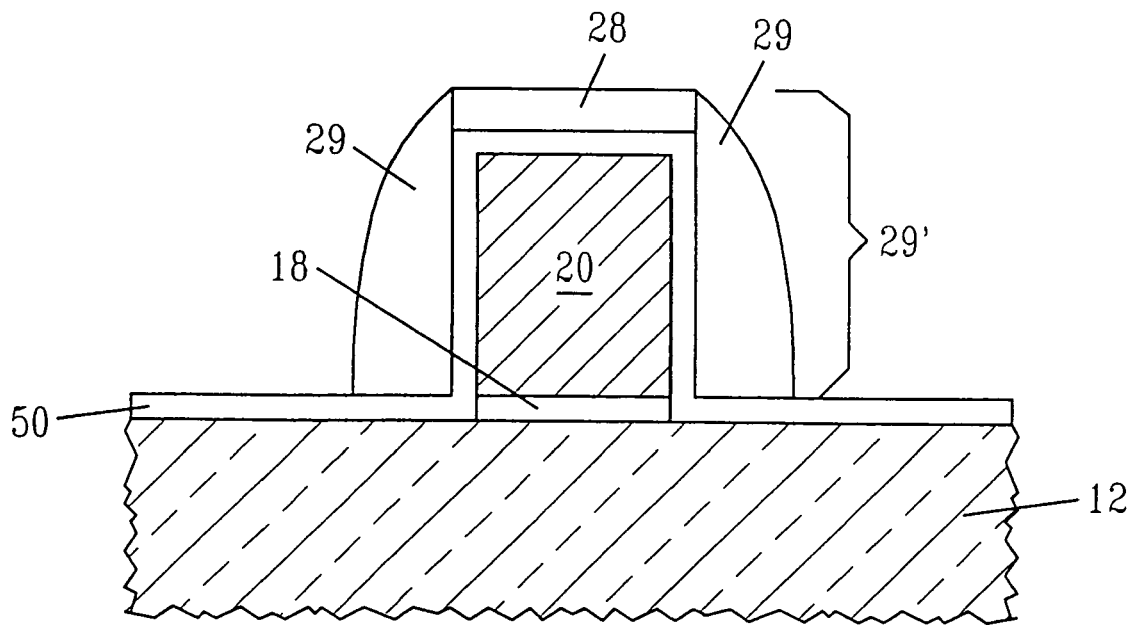

The structure shown in FIG. 4I or 4J can be subjected to further CMOS processing similar to that described above in fabricating the structures shown in FIGS. 2A and 2B. The structure provided in the second embodiment of the present invention, similar to that of the first embodiment, exhibits a reduction in capacitance which has been quantified with 3D finite-element modeling. The reduction in capacitance between the gate conductor and the contact via was again found to be from 30% to greater than 40% depending on the specific geometry. The total outer-fringe capacitance is reduced about 10 to about 18% by the inventive structure.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of forming a CMOS structure including a self-aligned low-k dielectric material atop at least a gate conductor comprising the steps of:

forming a conformal low-k liner on exposed surfaces of a structure comprising at least one gate region including a gate conductor located atop a surface of a semiconductor substrate, said low-k liner having a dielectric constant of about 5 or less;

forming a planarized polymeric material on said structure including said conformal low-k liner;

recessing said planarized polymeric material to expose a portion of the structure including the low-k liner atop the gate conductor;

treating the exposed portion to change etching properties thereof;

removing the recessed planarized polymeric material selective to the treated portion;

removing the low-k liner that is not protected with said treated portion; and removing said treated portion to provide a structure including a sleeve around the gate conductor which is comprised of the remaining low-k liner.

2. The method of claim 1 further comprising forming a metallic film on said conformal low-k liner prior to forming said planarized polymeric material.

3. The method of claim 1 further comprising forming a stress inducing layer on at least exposed surfaces of said semiconductor substrate.

4. The method of claim 1 further comprising forming contact vias that extend to silicided source/drain regions that are located in the semiconductor substrate and abut the gate conductor.

5. A method of forming a complementary metal oxide semiconductor (CMOS) structure including a self-aligned low-k dielectric constant material atop at least a gate conductor comprising the steps of:

forming a conformal oxide layer on surfaces of a structure including at least a gate conductor located on a surface of a semiconductor substrate;

forming a high density plasma nitride layer on horizontal surfaces of said structure including said conformal oxide layer;

forming a planarized sacrificial material on said structure, wherein said planarized sacrificial material leaves the high density plasma nitride atop the gate conductor exposed;

removing the exposed high density plasma nitride to provide a recess that exposes the conformal oxide layer atop the gate conductor;

filling said recess with a low-k dielectric material having a dielectric constant of about 5 or less so that said low-k dielectric material is located atop the gate conductor; and removing the sacrificial material.

6. The method of claim 5 further comprising removing the remaining high density plasma nitride from atop the semiconductor substrate.

7. The method of claim 6 further comprising forming another low-k dielectric material on said structure after removing the remaining high density plasma nitride and etching said another low-k dielectric material to provide a sleeve of low-k dielectric around the gate conductor.

8. The method of claim 5 further comprising forming a stress inducing layer on at least exposed surfaces of said semiconductor substrate.

9. The method of claim 5 further comprising forming a contact via that extends to silicided source/drain regions that are located in the semiconductor substrate and abut the gate conductor.

* * * * *